US011355696B2

(12) United States Patent
Chen et al.

(10) Patent No.: US 11,355,696 B2
(45) Date of Patent: Jun. 7, 2022

(54) MAGNETIC TUNNEL JUNCTION STRUCTURES AND RELATED METHODS

(71) Applicant: Taiwan Semiconductor Manufacturing Co., Ltd., Hsinchu (TW)

(72) Inventors: Jun-Yao Chen, Hsinchu (TW); Chun-Heng Liao, Hsinchu (TW); Hung Cho Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/900,550

(22) Filed: Jun. 12, 2020

(65) Prior Publication Data

US 2021/0391530 A1    Dec. 16, 2021

(51) Int. Cl.
*H01L 43/02* (2006.01)
*H01L 27/22* (2006.01)
*H01L 43/12* (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 43/12; H01L 27/228
USPC ....................................................... 257/427
See application file for complete search history.

(56) References Cited

U.S. PATENT DOCUMENTS

| | | |
|---|---|---|
| 9,941,333 B2 | 4/2018 | Jeong et al. |
| 10,644,231 B2 | 5/2020 | Peng et al. |
| 2005/0020011 A1* | 1/2005 | Nakajima ............... H01L 43/08 438/257 |
| 2007/0053114 A1* | 3/2007 | Uesugi ................ H01F 10/3254 360/324.2 |
| 2013/0292633 A1 | 11/2013 | Pellizzer et al. |
| 2016/0351568 A1 | 12/2016 | Chang et al. |
| 2017/0018704 A1 | 1/2017 | Chuang et al. |
| 2018/0040817 A1 | 2/2018 | Chuang et al. |
| 2020/0075074 A1 | 3/2020 | Chiang et al. |
| 2020/0075299 A1* | 3/2020 | Wu ..................... H01L 21/2855 |
| 2020/0098982 A1 | 3/2020 | Chuang et al. |

(Continued)

FOREIGN PATENT DOCUMENTS

| | | |
|---|---|---|
| DE | 10 2016 014 924 A1 | 6/2017 |
| DE | 10 2019 116 497 A1 | 1/2020 |
| KR | 10-2016-0140321 A | 12/2016 |

(Continued)

*Primary Examiner* — Tu-Tu V Ho
(74) *Attorney, Agent, or Firm* — Seed IP Law Group LLP

(57) ABSTRACT

The present disclosure relates to a magneto-resistive random access memory (MRAM) cell having an extended upper electrode, and a method of formation. In some embodiments, the MRAM cell has a magnetic tunnel junction (MTJ) arranged over a conductive lower electrode. A conductive upper electrode is arranged over the magnetic tunnel junction. Below the conductive lower electrode is a first conductive via structure in a first dielectric layer. Below the conductive via structure is a discrete conductive jumper structure in a second dielectric layer. A dielectric body of a third dielectric material that is different from the first dielectric material and the second dielectric material extends vertical from the first dielectric layer at least partially into the second dielectric layer.

19 Claims, 20 Drawing Sheets

(56) References Cited

U.S. PATENT DOCUMENTS

2020/0106008 A1    4/2020  Peng et al.
2020/0119258 A1    4/2020  Chuang et al.

FOREIGN PATENT DOCUMENTS

| KR | 10-2017-0009668 A | 1/2017 |
| KR | 10-2020-0028278 A | 3/2020 |
| KR | 10-2020-0035847 A | 4/2020 |
| KR | 10-2020-0037058 A | 8/2020 |

* cited by examiner

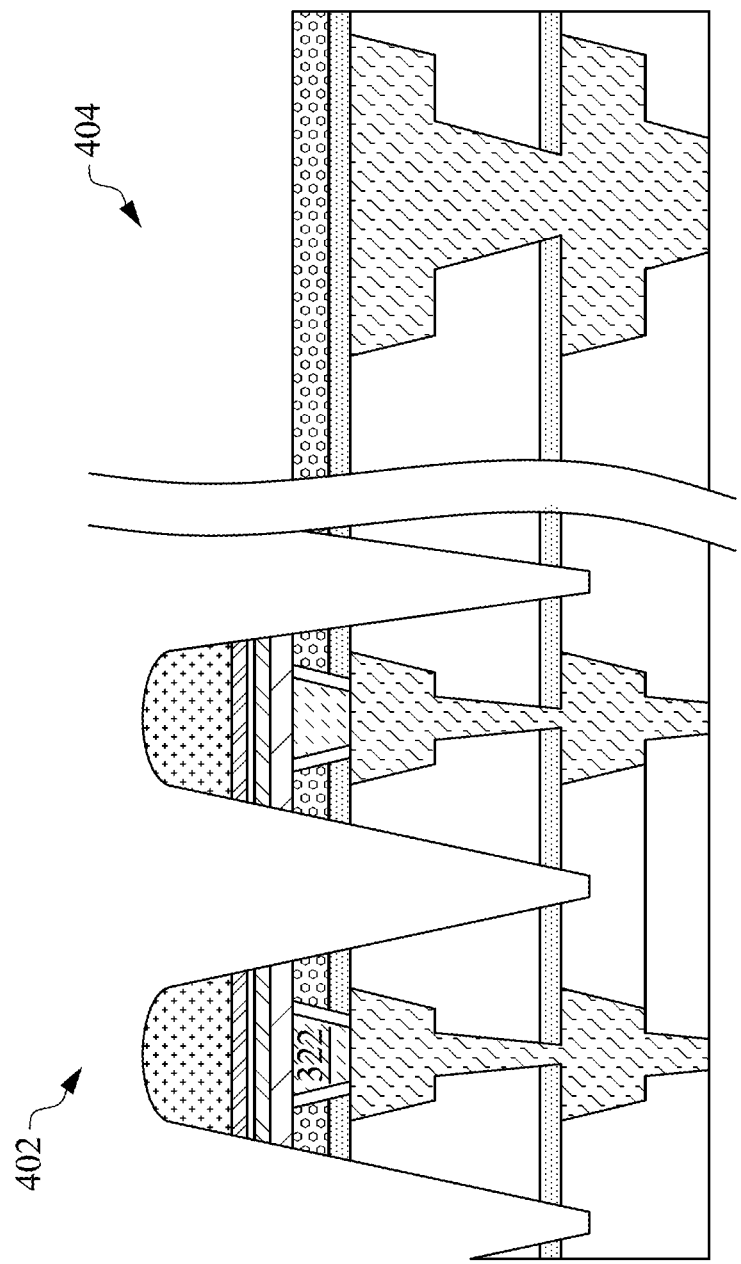

MAGNETIC TUNNEL JUNCTION STRUCTURES AND RELATED METHODS

BACKGROUND

Magnetoresistive random-access memory ("MRAM") is a promising non-volatile data storage technology. The core of a MRAM storage cell (or "bit") is a magnetic tunnel junction ("MTJ") in which a dielectric layer is sandwiched between a magnetic fixed layer ("reference layer") and a magnetic free layer ("free layer") whose magnetization orientation can be changed. Due to the tunnel magnetoresistance effect, the resistance value between the reference layer and the free layer changes with the magnetization orientation switch in the free layer. Parallel magnetizations ("P state") lead to a lower electric resistance, whereas antiparallel magnetizations ("AP state") lead to a higher electric resistance. The two states of the resistance values are considered as two logic states "1" or "0" that are stored in the MRAM cell.

In a spin transfer torque MRAM ("STT-MRAM") cell, the write current is applied passing through the entire MTJ, i.e., reference layer, the dielectric layer, and the free layer, which sets the magnetization orientation of the free layer through the spin transfer torque effect. That is, the write current passes through a same path as the read path of the MRAM. In a spin-orbit torque MRAM ("SOT-MRAM") cell, a MTJ structure is positioned on a heavy metal layer with large spin-orbit interaction. The free layer is in direct contact with the heavy metal layer. Spin torque is induced by the in-plane current injected through the heavy metal layer under the spin-orbit coupling effect, which generally include one or more of the Rashba effect or the spin Hall effect ("SHE effect"). The write current does not pass through the vertical MTJ. Instead, the write current passes through the heavy metal layer. The magnetization orientation in the free layer is set through the spin-orbit torque effect. More specifically, when a current is injected in-plane in the heavy metal layer, the spin-orbit coupling leads to an orthogonal spin current which creates a spin torque and induces magnetization reversal in the free layer.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 4A to 4M show a wafer in various stages of a second fabrication process according to example embodiments of the disclosure.

DETAILED DESCRIPTION

Figure 1:
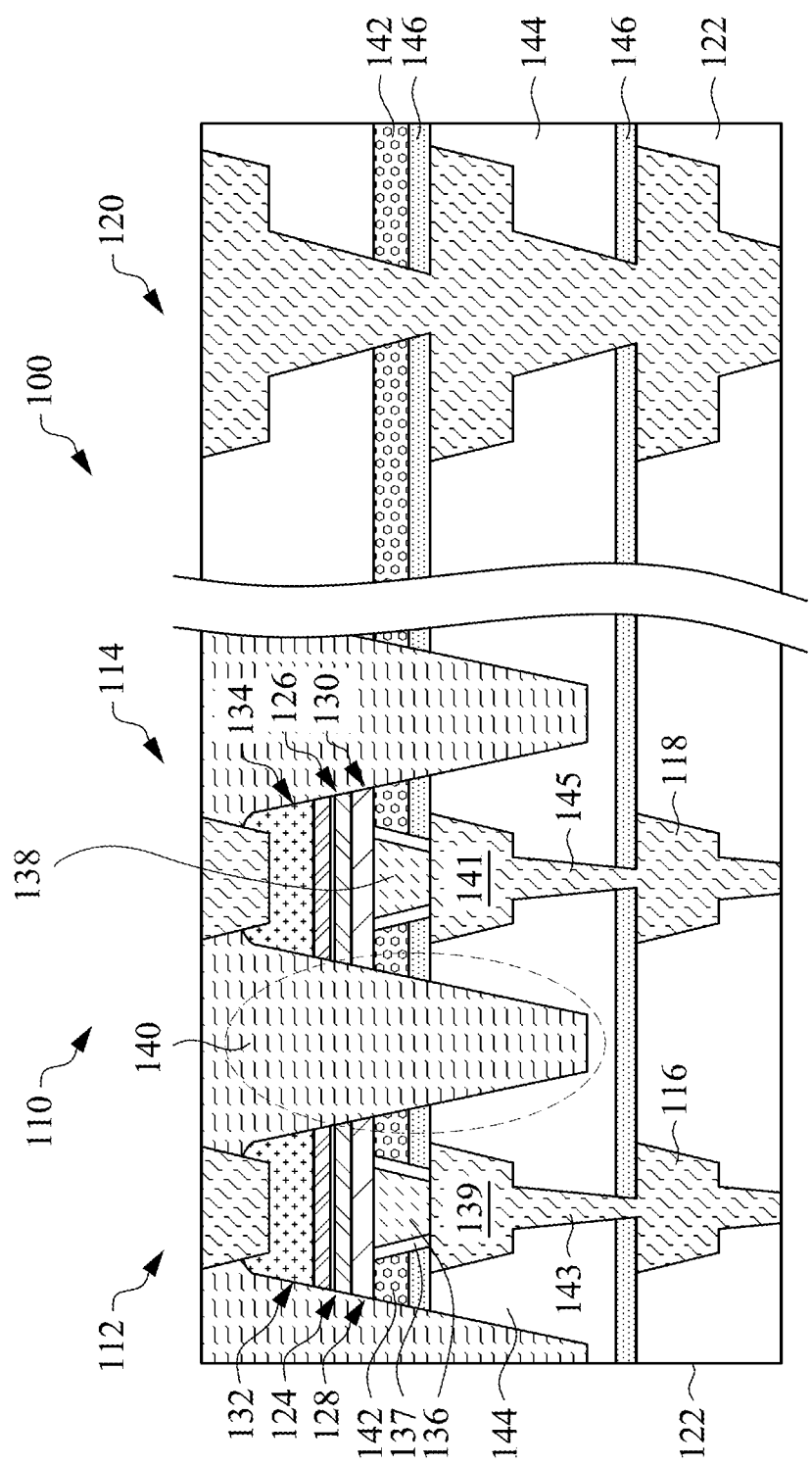
FIG. 1 is an example MRAM structure according to example embodiments of the disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The current techniques in accordance with embodiments described herein achieve a relatively thin bottom-electrode via ("BEVA") and a corresponding relatively thin dielectric layer surrounding the BEVA. The logic area of the IC chip also includes the relatively thin dielectric layer for the BEVA, which includes a different dielectric material from other inter-layer dielectric ("ILD") layers. The relatively thinner dielectric layer for the BEVA also enables easier integration of the fabrication process on the MTJ area and the fabrication process on the logic area.

The MTJ structure is formed in a back-end-of-line (BEOL) process over one or more metallization layers. Layers of the MTJ materials are blankly formed on the MTJ area and the logic area over the bottom electrode ("BE") layer and the ILD for the BEVA. Although the BEVA is formed only in the MTJ area, not in the logic area, the ILD for the BEVA is blankly formed over the MTJ area and the logic area. The metallization layers below ILD for the BEVA may include metal wirings or other metal features arranged with high density. The disclosed additional jumper introduces an additional jumper structure(s) below the ILD for the BEVA. Due to the additional jumper structures, there is more spatial allowance for an IBE process, which has low selectivity between the MTJ materials and the metallization layers, in forming MTJ structures from the MTJ layers. Specifically, when the IBE process etches out the MTJ material to form sidewalls of a MTJ structure, the IBE process also etches out portions of layers below the MTJ structure. The additional jumper structure(s) provides more space or distance between the MTJ structure and the metallization layers below the MTJ structure such that the IBE process will not damage the features formed in the metallization layers below the MTJ structure, referred to as "target features" for descriptive purposes. The additional jumper structure(s) is also included in the logic area. With the additional space enabled by the additional jumper structure (s), the BEVA and the ILD for the BEVA can be made relatively thin.

In an embodiment, the additional jumper structure is formed in an additional ILD layer. A recess formed by the IBE process extends vertically through the dielectric layer of or surrounding the BEVA and partially extends into the additional ILD layer. The recess does not extend through the additional ILD layer of the additional jumper structure and stops before reaching the bottom surface of the additional ILD layer.

FIG. 1 shows a portion of an example integrated circuit ("IC") 100. The IC 100 includes a first portion 110 having a plurality of MRAM cells, MRAM cells 112, 114 shown for illustration. The IC 100 also includes a second portion 120 that have other circuit elements (not shown in FIG. 1) from MRAM cells, e.g., logic circuit elements. FIG. 1 shows the BEOL layers and structures of the IC circuit 100. The MRAM cells 112, 114 are formed in the BEOL process over target features 116, 118 in an ILD layer 122. In an embodiment, the target features 116, 118 are metallization features like metal inter-connection structures or metal wire structures. The MRAM cell 112, 114 each includes a MTJ structure 124, 126, respectively. The MTJ structures 124, 126 are each vertically adjacent to a lower electrode ("BE") 128, 130, and a top electrode ("TE") 132, 134, respectively. Interconnect structures, e.g., connection vias, 136, 138 connect the BE 128, 130, to metallization features, e.g., the target features 116, 118 below, respectively. Specifically, one or more jumper structures 139, 141 are positioned vertically between the interconnect structures 136, 138 and the target features 116, 118. The jumper structures 139, 141 are connected to the target features 116, 118 through interconnect structures 143, 145, respectively. The jumper structures 139, 141 are discrete structures. In an embodiment, the jumper structures 139, 141 include a same conductive material as the target features 116, 118 in the various metallization levels. The jumper structures 139, 141 include a different conductive material from the interconnect structures 136, 138.

A dielectric body 140 is positioned adjacent to the MRAM cell 112, 114 and extends vertically through a dielectric layer 142 of the BEVA 136 and extends into another ILD layer 144 that is positioned immediately below the dielectric layer 142 and above the ILD layer 122 of the target features 116, 118. The dielectric body 140 does not extend into the dielectric layer 122 of the target features 116, 118.

In an embodiment, the BE 128, 130 includes a conductive nitride that has a magnetic property suitable for the operation of the respective MTJ structure 124, 126. For example, the conductive nitride material of the BE 128, 130 does not affect pinning the magnetic polarization of a fix layer of the MTJ structure 124, 126. In an embodiment, the BE 128, 130 are one or more of TaN or TiN. The BEVA 136 includes a material that matches the electrical and magnetic properties of the BE 128, 130. In an embodiment, the BEVA 136 is TiN. In some embodiment, the BEVA 136 also includes a barrier or liner layer 137 of one or more of Ta or TaN that prevent the TiN material from permeating into the surrounding dielectric layer 142. The dielectric layer 142 includes SRO or TEOS or other dielectric material that is suitable with the materials of the BEVA structure 136. The dielectric body 140 includes a different dielectric material from that of the ILD layers 144, 122 and from that of the dielectric layer 142. In an embodiment, a dielectric material of the dielectric body 140 has a high gap filling property. For example, the dielectric body 140 is high density plasma ("HDP") dielectric and a high aspect ratio process ("HARP") dielectric for the gap filling properties thereof.

In an embodiment, the ILD layers 144, 122 and the dielectric layer 142 are globally formed over the wafer surface of the IC 100. That is, the dielectric layers 144, 122, 142 on the first portion 110 and the second portion 120 are portions of the same layers, respectively. In an embodiment, etch stop layers 146 are positioned between adjacent dielectric layers. The etch stop layer 146 includes different dielectric material from that of the dielectric layers 142, 122, 144. In an embodiment, the etch stop layer 146 is silicon carbide "SiC".

The descriptions of the MRAM cell 112 also apply to the MRAM cell 114. The dielectric body 140 is positioned laterally between the BE 128 and the BE 130 of the MRAM cell 112, 114, respectively. The dielectric body 140 extends vertically through the dielectric layer 142 and partially into the dielectric layer 144 of the jumper structures 139, 141.

Figure 2:
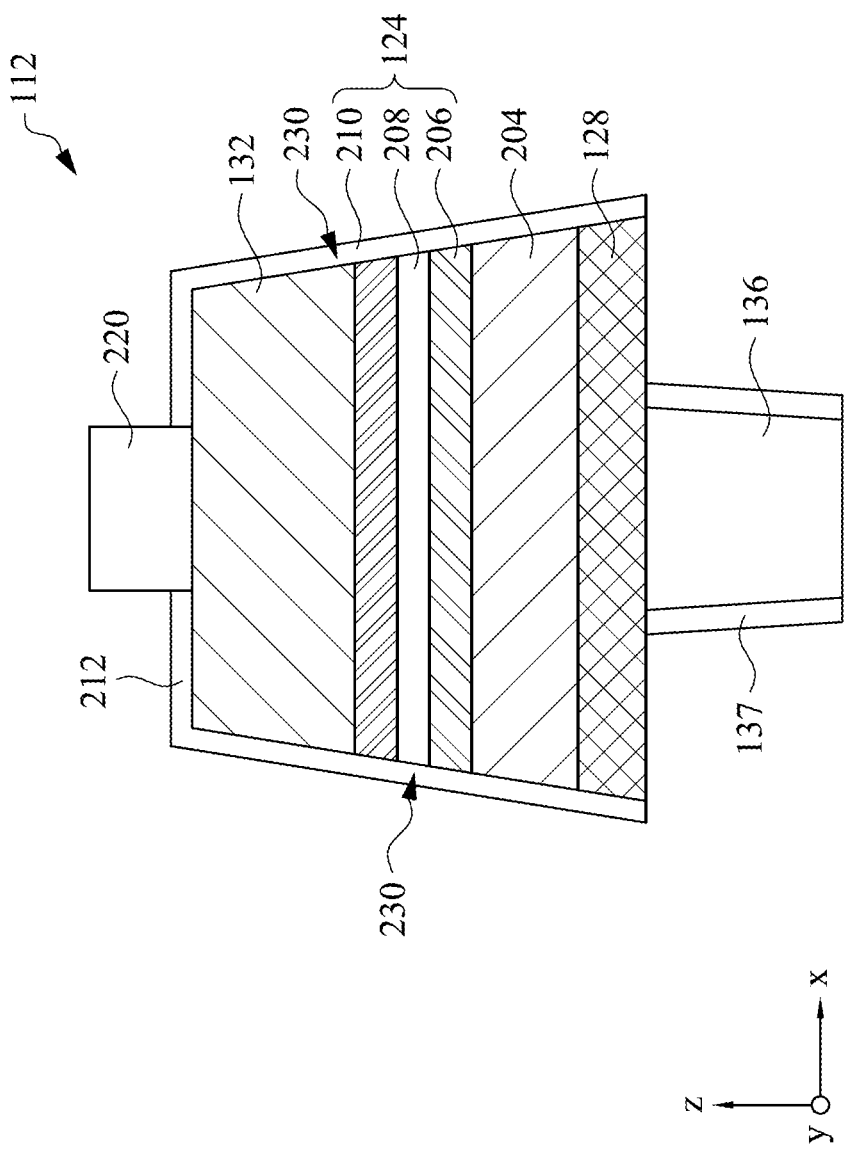
FIG. 2 is an example MRAM cell according to example embodiments of the disclosure.

FIG. 2 shows an example MRAM cell 112. Referring to FIG. 2, the MRAM cell 112 includes a conductive lower electrode 128. An anti-ferromagnetic layer 204 is arranged over the conductive lower electrode 128, and a pinned magnetic layer 206 is arranged over the anti-ferromagnetic layer 204. The anti-ferromagnetic layer 204 includes a material with strong exchange coupling, which has atoms with magnetic moments aligned in a regular pattern with neighboring spins pointing in opposite directions. The strong exchange coupling allows for the anti-ferromagnetic layer 204 to pin (i.e., fix) the magnetic polarization of the pinned magnetic layer 206, thereby preventing the magnetic polarization of the pinned magnetic layer 206 from switching, e.g., during write operations of the MRAM cell 112. To this extent, the pinned magnetic layer 206 is also referred to as a fix layer 206 of the MTJ structure 124. In some embodiments, a synthetic anti-ferromagnetic (SAF) layer (not shown for simplicity) may be disposed between the anti-ferromagnetic layer 204 and the pinned magnetic layer 206.

In the MTJ structure 124, the pinned magnetic layer 206 is vertically separated from a free magnetic layer 210 by way of a dielectric barrier layer 208. The free magnetic layer 210 or free layer 210 includes a magnetic polarization that is capable of switching between a parallel configuration and an anti-parallel configuration with respect to that of the pinned magnetic layer 206. A conductive upper electrode or top electrode 132 is disposed over the free magnetic layer 210. Optionally, a dielectric cap or spacer layer 212 of, e.g., silicon nitride (SiN), is arranged around the MRAM cell 112. The spacer layer 212 may also be carbide (SiC), silicon dioxide ($SiO_2$), silicon oxy-nitride (SiON), silicon oxy-carbide (SiOC), and/or a low-k dielectric material.

The pinned magnetic layer 206, the dielectric barrier layer 208, and the free magnetic layer 210 form the magnetic tunnel junction (MTJ) 124. Within the MTJ 124, electrons may tunnel through the dielectric barrier layer 208 upon application of a differential voltage between the conductive lower electrode 128 and the conductive upper electrode 132. As the electrons tunnel through the dielectric barrier layer 208, the magnetic polarization of the free magnetic layer 210 may change, thereby changing a resistance value of the MTJ 124. For example, if a polarity of the free magnetic layer 210 is aligned with a polarity of the pinned magnetic layer 206, the MTJ 124 has a first resistance value corresponding to a first data state, e.g., a logical "0". If the polarity of the free magnetic layer 210 is misaligned with the polarity of the pinned magnetic layer 206, the MTJ 124 has a second resistance value corresponding to a second data state, e.g., a logical "1".

A via 220 is disposed onto the upper portion of the conductive upper electrode 132. The via 220 is configured to connect the conductive upper electrode 132 to additional back-end-of-the-line (BEOL) metallization layers, e.g., a metal wire.

In some embodiments, the conductive lower or bottom electrode 128 may include titanium nitride (TiN), tantalum nitride (TaN), titanium (Ti), and/or tantalum (Ta). In some embodiments, the conductive lower electrode 128 may have a thickness in a range of between approximately 10 nm and approximately 100 nm. In some embodiments, the anti-ferromagnetic layer 204 may include iridium manganese (IrMn), iron manganese (FeMn), ruthenium manganese (RuMn), nickel manganese (NiMn), and/or palladium platinum manganese (PdPtMn). In some embodiments, the pinned magnetic layer 206 may comprise cobalt (Co), iron (Fe), boron (B), and/or ruthenium (Ru). In some embodiments, the pinned magnetic layer 206 may have a thickness in a range of between approximately 5 nm and approximately 10 nm.

In some embodiments, the dielectric barrier layer 208 may include magnesium oxide (MgO) and/or aluminum oxide ($Al_2O_3$) and may have a thickness in a range of between approximately 0.5 nm and approximately 2 nm. In some embodiments, the free magnetic layer 210 may include one or more of cobalt (Co), iron (Fe), and boron (B) and may have a thickness in a range of between approximately 1 nm and approximately 3 nm.

In some embodiment, the conductive upper electrode 132 may comprise titanium nitride (TiN), tantalum nitride (TaN), titanium (Ti), and/or tantalum (Ta).

In some embodiments, cross-sections (in a x-z plane) of the free magnetic layer 210, the dielectric barrier layer 208, the pinned magnetic layer 206, the anti-ferromagnetic layer 204, and the conductive lower electrode 128 are substantially acute trapezoid, either individually or together as a group. Widths of the free magnetic layer 210, the dielectric barrier layer 208, the pinned magnetic layer 206, the anti-ferromagnetic layer 204, and the conductive lower electrode 128 keep increasing along the downward direction, in z-axis. This acute trapezoid cross-sectional shape is a result of an IBE process used to form sidewalls 230 of the MRAM cell 112. In other words, the free magnetic layer 210, the dielectric barrier layer 208, the pinned magnetic layer 206, the anti-ferromagnetic layer 204, and the conductive lower electrode 128 have substantially aligned and sloped sidewalls.

Figure 3A:
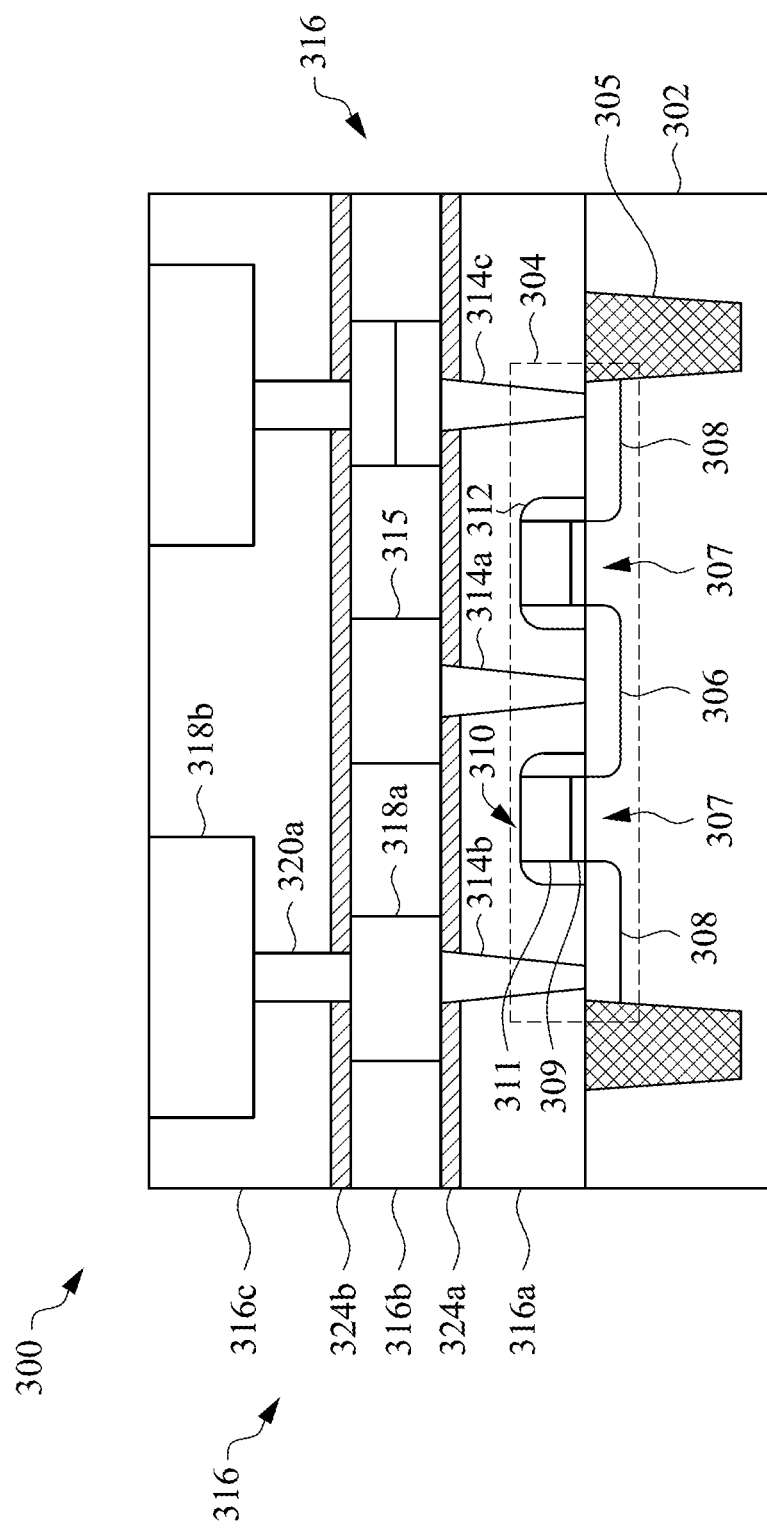
FIGS. 3A to 3E show a wafer in various stages of a first fabrication process according to example embodiments of the disclosure.

FIGS. 3A to 3E illustrate a wafer 300 in various fabrication stages of forming the IC 100, the MRAM cell 112, or other semiconductor structures. Referring to FIG. 3A, a wafer 300 is received. The wafer 300 includes a semiconductor body 302. The semiconductor body 302 may be, for example, a bulk semiconductor substrate, such as a bulk silicon substrate, or a silicon-on-insulator (SOI) substrate. One or more selection transistors 304 are arranged within the semiconductor body 302. In some embodiments, the one or more selection transistors 304 are disposed between isolation regions 305 (e.g., STI regions).

In some embodiments, the one or more selection transistors 304 may comprise MOSFET (metal-oxide-silicon field effect transistor) devices. In such embodiments, the one or more selection transistors 304 respectively comprise a source region 306 and a drain region 308, separated by a channel region 307. The source region 306 comprises a first doping type (e.g., an n-type dopant), the channel region 307 comprises a second doping type different than the first doping type, and the drain region 308 comprises the first doping type. In some embodiments, the first doping type comprises an n-type doping, while in other embodiments the first doping type comprises a p-type doping. A gate structure 310, comprising a gate electrode 311 separated from the channel region 307 by a gate oxide layer 309, is configured to control the flow of charge carriers between the source region 306 and the drain region 308. In various embodiments, the gate structure 310 may comprise a doped polysilicon material or a metal material (e.g., TiN, Al, etc.). In some embodiments, sidewalls spacers 312 (e.g., SiN spacers) may be disposed on opposing sides of the gate electrode 311.

A back-end-of-the-line (BEOL) metal stack is disposed over the semiconductor body 302. The BEOL metal stack comprises a first contact 314a a configured to connect the source region 306 to a first metal wire layer 315 that acts as a source line. The BEOL metal stack further comprises a plurality of metal interconnect layers that to connect to the drain regions 308, the gates or other terminals. In some embodiments, the plurality of metal interconnect layers may comprise one or more metal contacts, 314b and 314c, disposed within a first inter-level dielectric (ILD) layer 316a, and configured to electrically couple the drain region 308 to a first metal wire layer 318a that is disposed within a second ILD layer 316b. As an example, the source line 315 is also disposed within the second ILD layer 316b. The metal features 318a, 315 formed within the second ILD layer 316b are also referred to as a first metallization level.

The plurality of metal interconnect layers may further comprise a first metal via layer 320a, disposed within a third ILD layer 316c, and configured to electrically couple the first metal wire layer 318a to a second metal wire layer 318b disposed within the third ILD layer 316c. The metal features, e.g., 318b, formed within the third ILD layer 316c are also referred to as a second metallization level.

One or more MRAM cells 112, 114 of FIG. 1 may be formed over the wafer 300. In some embodiments, the inter-level dielectric (ILD) layers 316 (316a, 316b, 316c) are separated by etch stop layers 324 of, e.g., SiN or SiC.

The metal interconnect layers 320a, 314b, 314a, 314c and the metal wires 318a, 315, 318b in the ILD layers 316a, 316b, 316c are target features to be protected from being damaged by an IBE process. FIG. 3A shows only one third ILD layer 316c above the first metallization level formed in the second ILD 316b for illustrative purposes only. It should be appreciated that a plurality of metallization levels may be formed over the second ILD layer 316b and the metal features in those metallization levels are target features to be protected from damage by an IBE process.

Figure 3B:
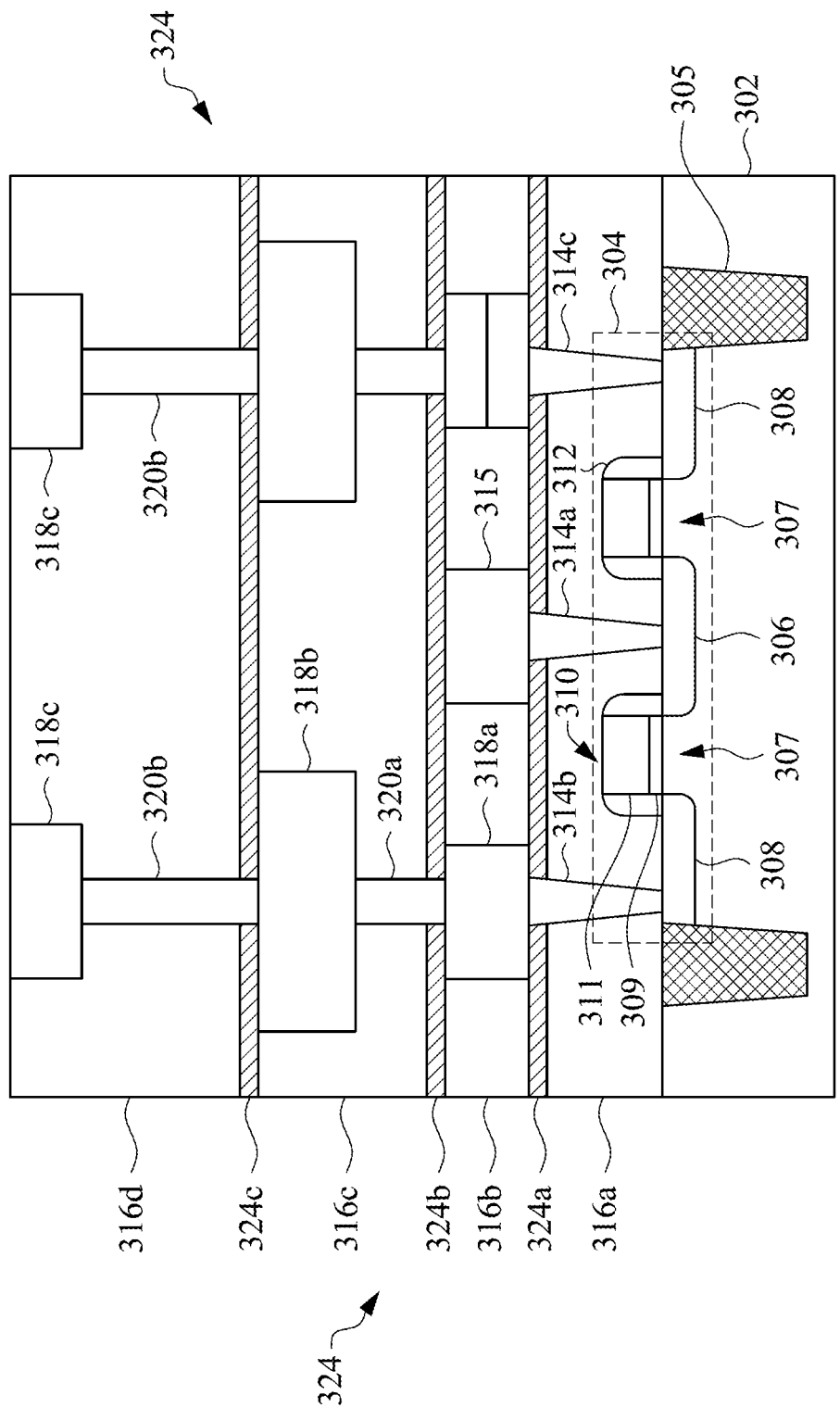

In FIG. 3B, an auxiliary metal jumper structure 318c is formed within an auxiliary ILD layer 316d over the third ILD layer 316c. The jumper structure 318c is connected to the metal wire 318b through an interconnect via 320b. The jumper structure 318c and the interconnect via 320b are formed for the purposes of providing an auxiliary vertical distance between the metal wire 318b and a MRAM cell 112, 114 formed thereover on the wafer 300. In an embodiment, the jumper structure 318c, the interconnect via 320b and the ILD 316d are formed with same processes and materials as those of the metal wire 318b, the via layer 320a and the third ILD 316c. For example, the jumper structure 318c and the interconnect via 320b are copper (Cu), aluminum (Al), Tungsten (W) or cobalt (Co). For example, the auxiliary ILD layer 316d may be formed by a thin film process, e.g., a CVD or a PVD process or other suitable thin film process. The via 320b may be formed through a damascene process. The jumper structure 318c may also be formed and patterned over the via 320b using metal deposition and patterning processes like a damascene process or a lift-off process.

Figure 3C:
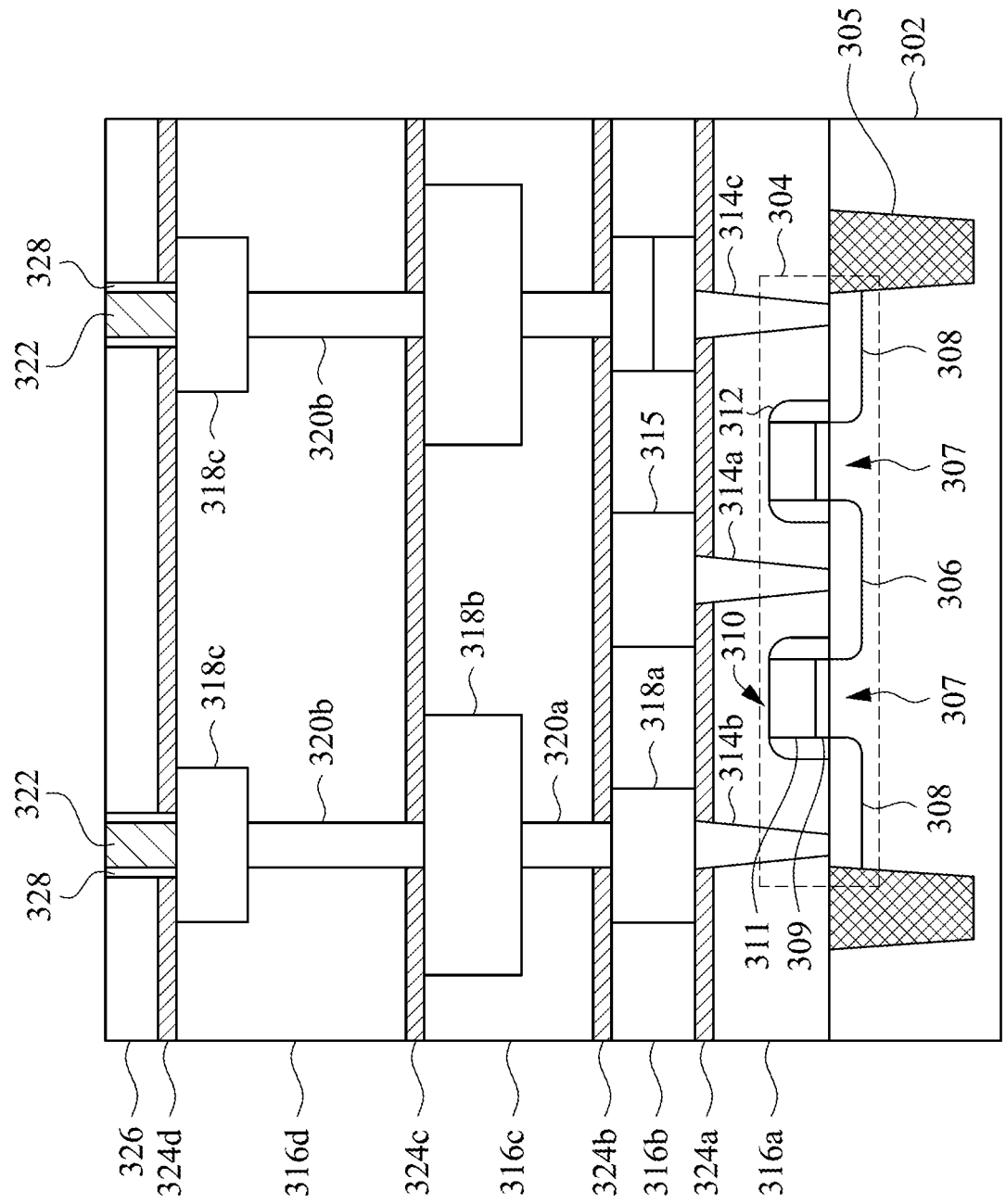

In FIG. 3C, a BEVA via structure 322 is firmed in a dielectric layer 326 over the auxiliary ILD layer 316d. The BEVA via structure 322 includes a different material from that of the via layers or structures 314b, 320a, 320b. In an embodiment, the BEVA via structure 322 is TiN. The dielectric layer 326 is a different dielectric material from that of the ILD layer 316 (316a, 316b, 316c, 316d) and is a material that is suitable for the deposition of the BEVA via structure 322 of, e.g., TiN. In an embodiment, the dielectric layer 326 is one or more of SrO or TEOS. In an embodiment, a barrier layer 328 is formed between the BEVA via structure 322 and the surrounding dielectric layer 326. The barrier layer 328 is one or more of Ta or TaN. The barrier layer 328 prevents the TiN elements from permeating into the surrounding dielectric layer 326.

In some embodiments, etch stop layers 324a, 324b, 324c, 324d are positioned between ILD layer 316a, 316b, 316c, 316d and dielectric layer 326, respectively. In some embodiments, etch stop layers 324a, 324b, 324c, 324d are Sic or other suitable dielectric materials.

Figure 3D:
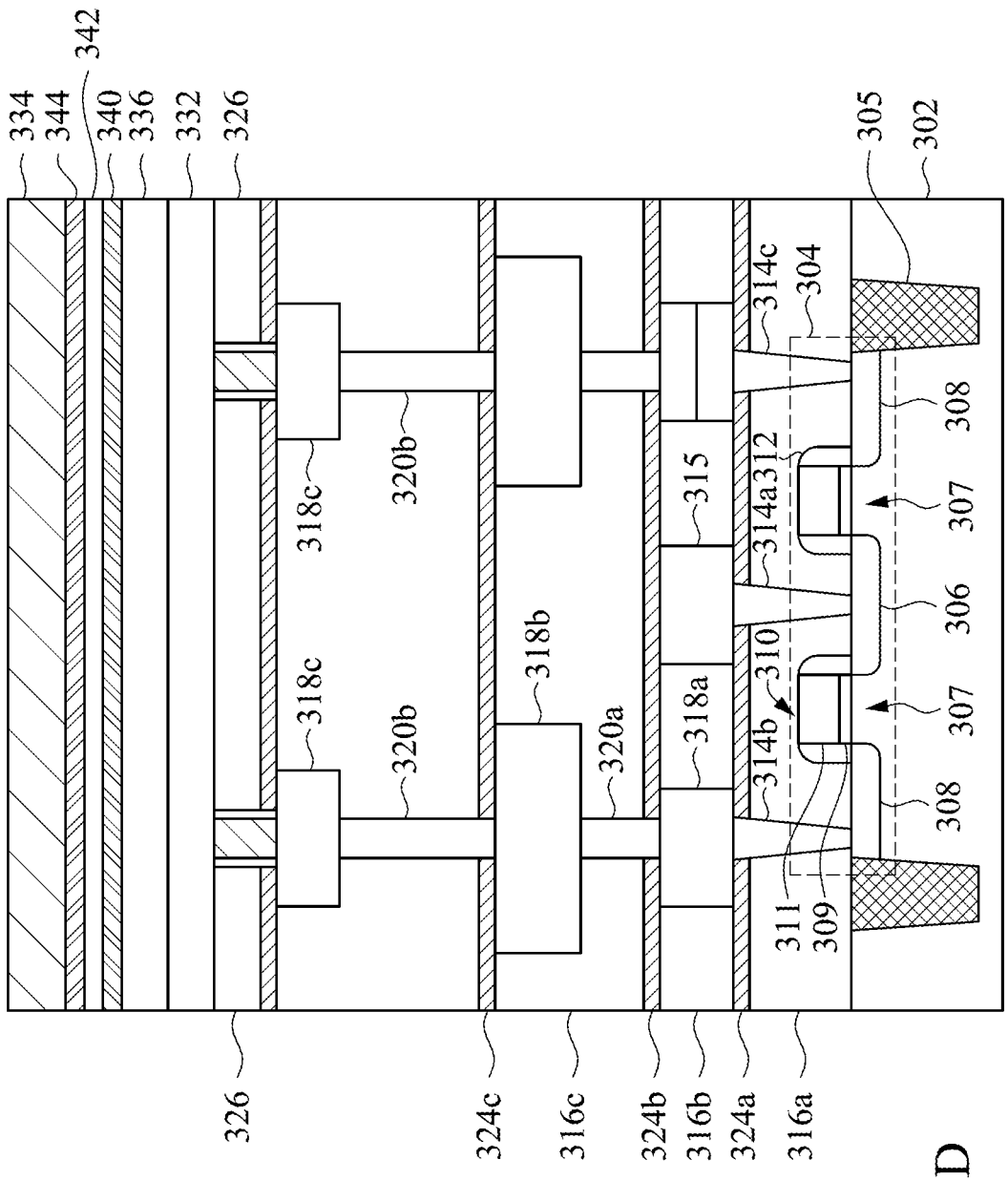

In FIG. 3D, a stack 330 of MRAM layers is formed over the dielectric layer 326. The MRAM stack 330 has a magnetic tunnel junction (MTJ) disposed between a conductive lower electrode layer 332 and an upper electrode layer 334. The MTJ comprises an anti-ferromagnetic layer 336, a pinned magnetic layer 340, a dielectric barrier layer 342, and a free magnetic layer 344.

Figure 3E:
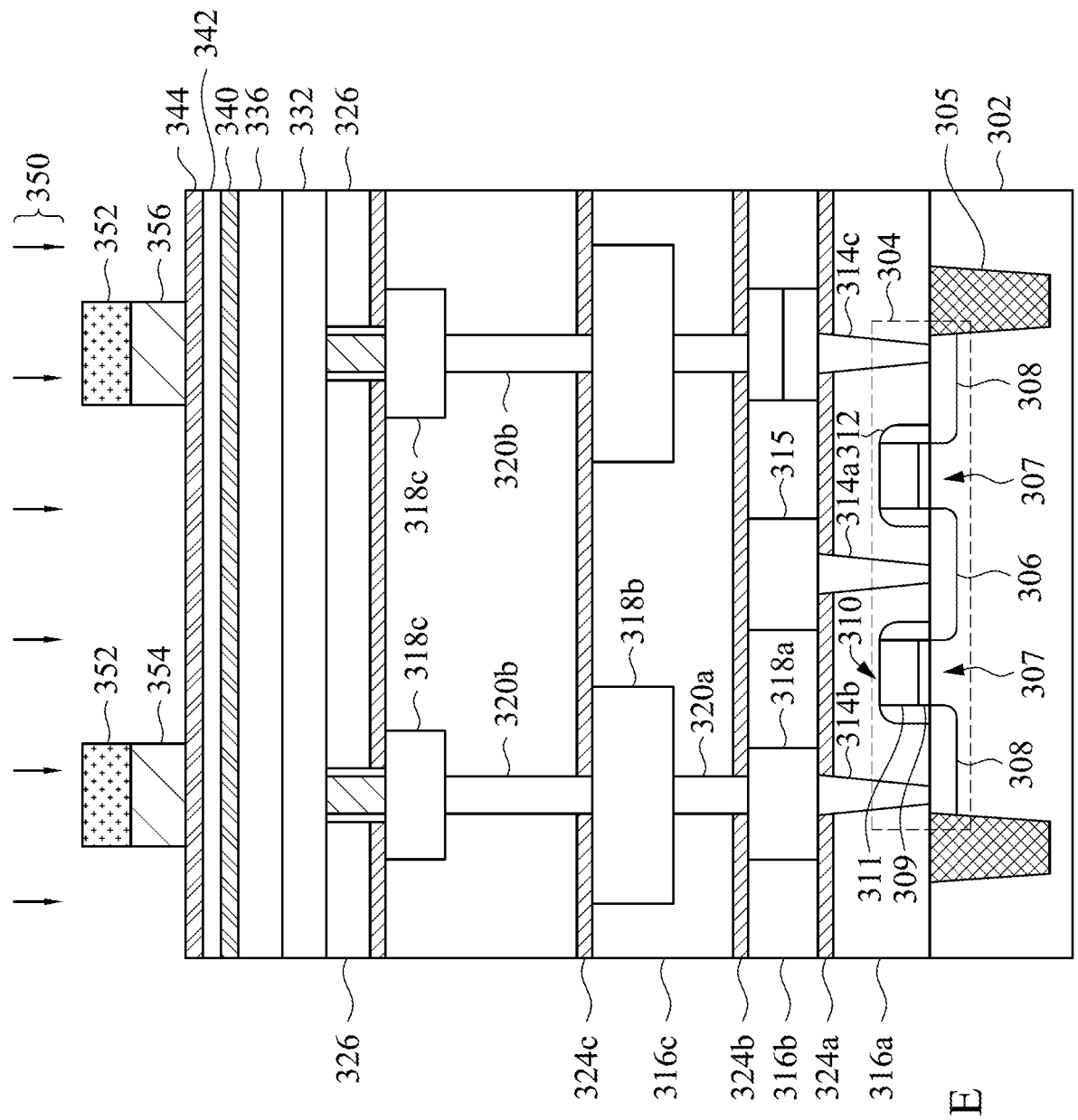

In FIG. 3E, a first etching process 350 is performed to pattern the upper electrode layer 334 according to a first masking layer 352 to form a conductive upper electrode structures 354, 356 for MRAM cells 112, 114, respectively.

FIGS. 4A to 4M illustrate further formation of MRAM cells 112, 114 using an IBE process on a wafer 300 made from FIGS. 3A to 3E or other wafers.

Figure 4A:
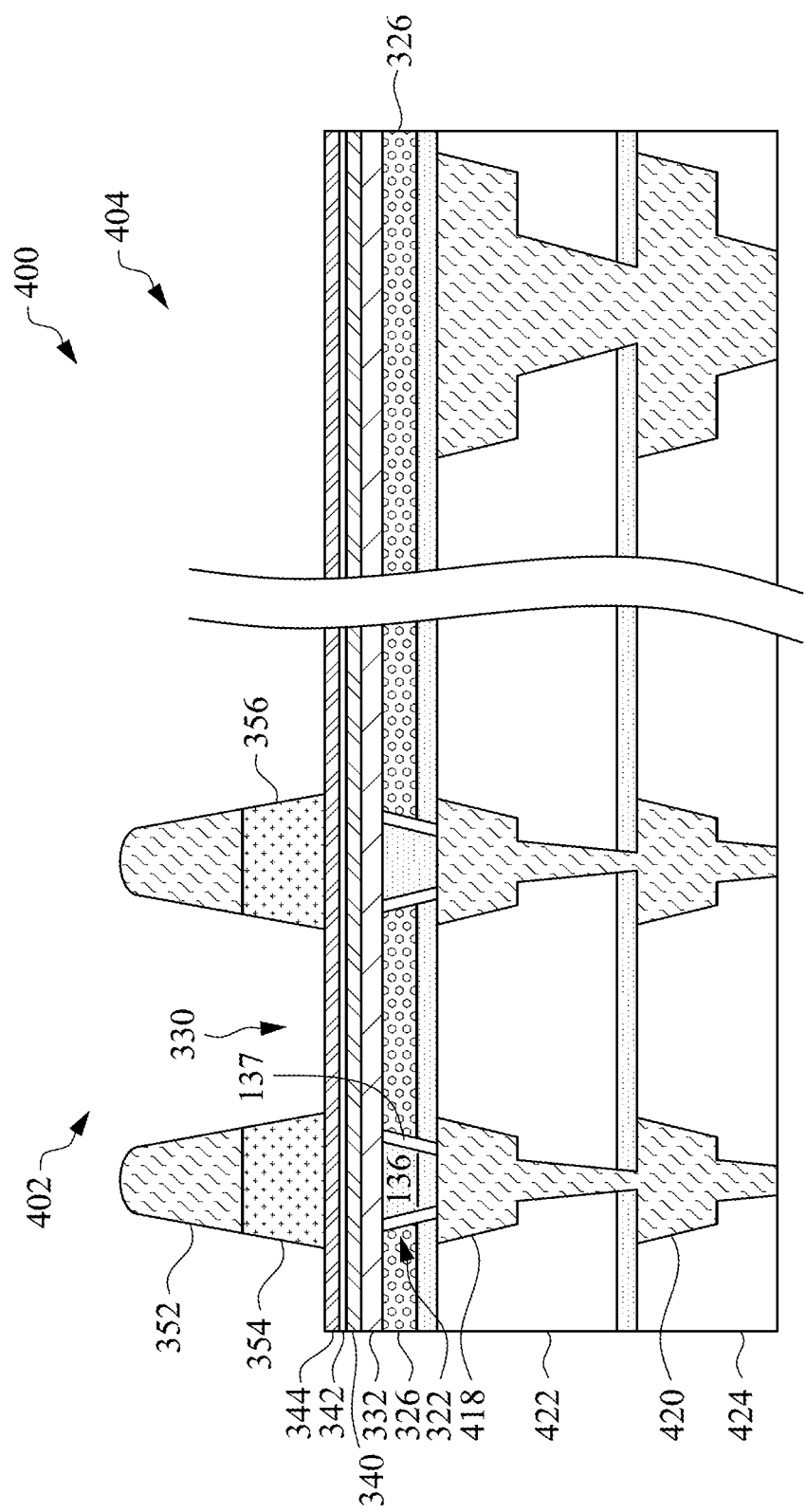

In FIG. 4A, an example wafer 400 is received. The example wafer 400 may be a same wafer as the wafer 300 after the processes of FIGS. 3A to 3E. The example wafer 400 is shown to have a first area 402 for MRAM cells and a second area 404 for other circuitry elements, e.g., logic elements.

FIG. 4A shows that two levels of jumper structures 418, 420 are formed in two auxiliary ILD layers 422, 424, respectively, below the BEVA via structure 322. The two levels of jumper structures 418, 420 further increase the distance between the MRAM stack 330 and the target features below the auxiliary ILD layers 422, 424, e.g., the target features 318b of FIG. 3D.

The MTJ stack 330 is globally formed also on the logic area 404. The patterning removes the layer 334 from the logic area 404 and exposes the free magnetic layer 344 on both the MTJ area 402 and the logic area 404 except for the portions covered by the upper electrodes 354, 356.

Figure 4B:
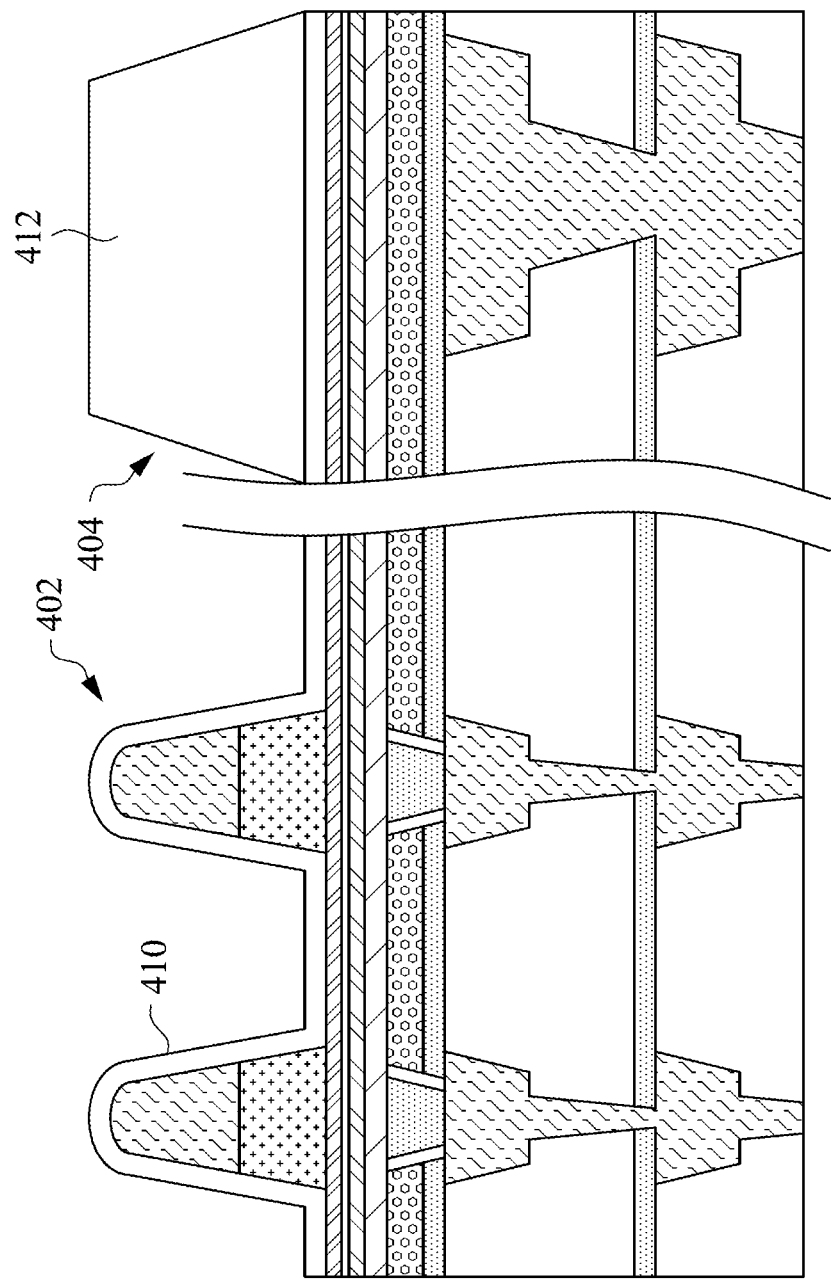

In FIG. 4B, an etch stop layer 410 is globally formed over the wafer 300. The etch stop layer 410 is configured to stop an IBE etching. In an example, the etch stop layer 410 is SiC. A mask layer 412 is formed to cover the logic area 404.

Figure 4C:
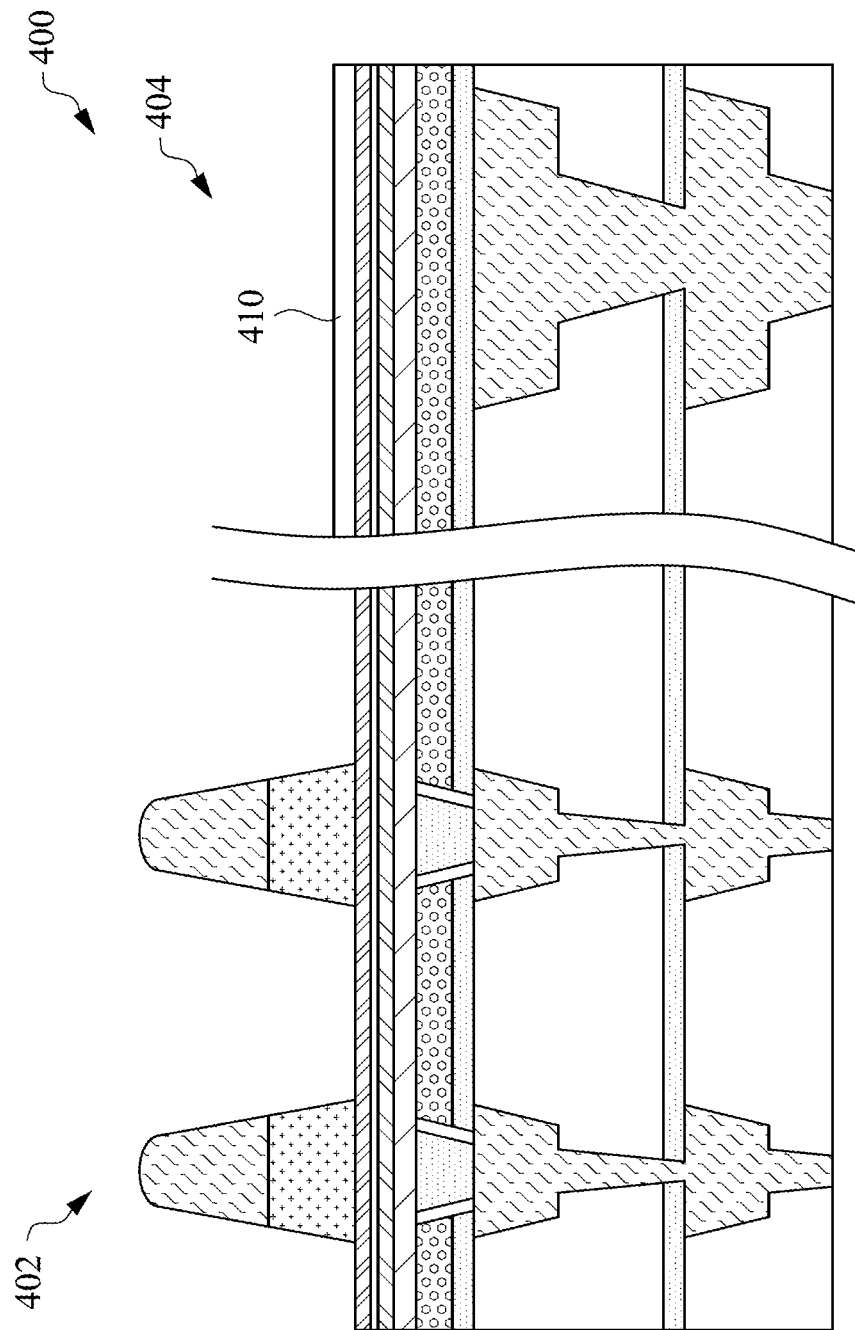

In FIG. 4C, the etch stop layer 410 is patterned using the mask layer 412 such that the first area 402 is exposed from the patterned etch stop layer 410 and the patterned etch stop layer 410 covers the second area 404 of the wafer 400.

Figure 4D:
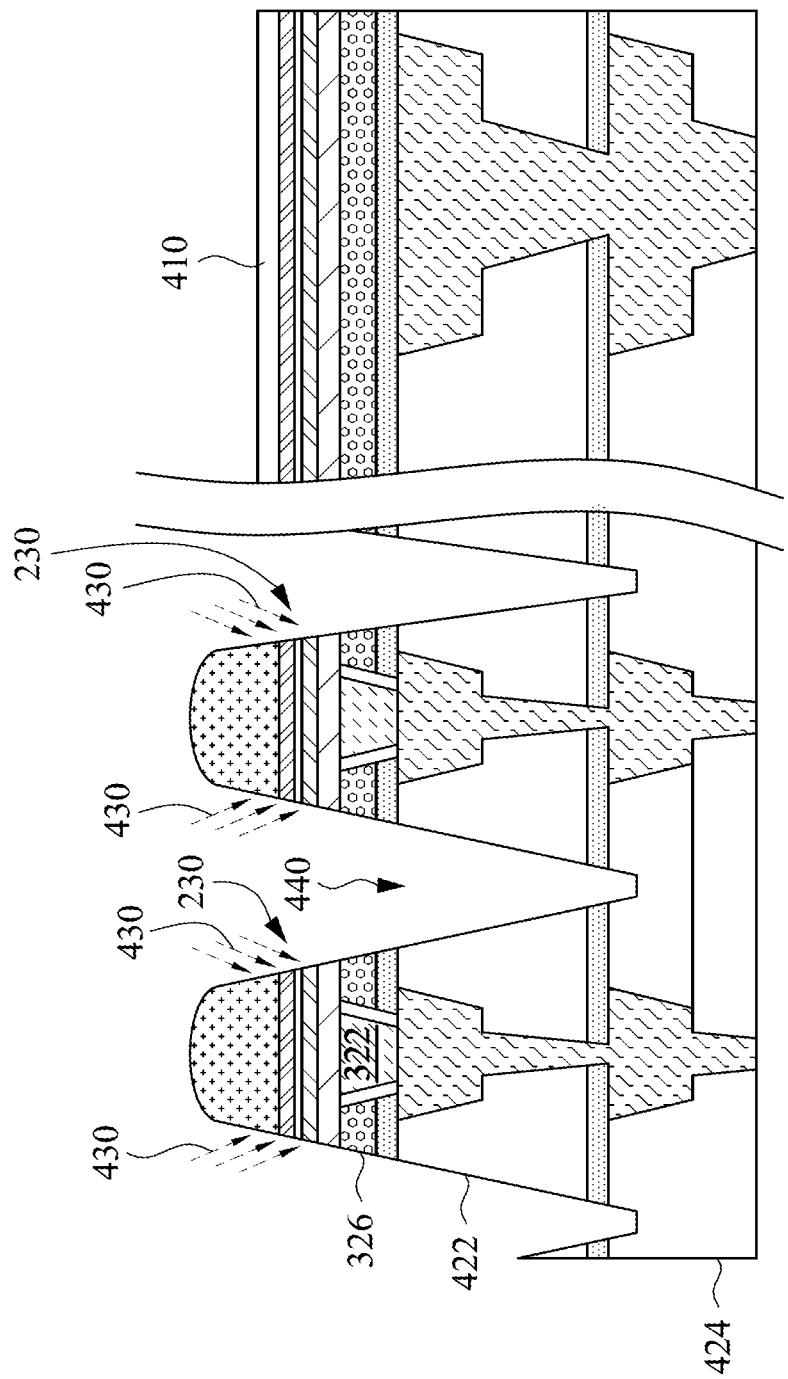

In FIG. 4D, an IBE process 430 is performed to pattern the MRAM stack 330 in the first area 402, with the second area 404 being coved by the etch stop layer 410. Specifically, sidewalls 230 of the MTJ structure are formed by the IBE process. Further, due to the low selectivity of the IBE process, a recess 440 is formed adjacent to the sidewall 230 and in the conductive lower electrode 332, the dielectric layer 326, the auxiliary ILD layer 422 a or even the auxiliary ILD layer 424. The recess 440 extends through the dielectric layer 326 of the BEVA via structure 322 and into the auxiliary ILD layers 422. The recess 440 stops at a point within the auxiliary ILD layer 422 or 424 before extending into the metallization levels where the target features are formed in. For example, the recess 440 does not extend into the third ILD layer 316c where the wire 318b is positioned.

As shown in FIG. 4E, after the IBE process is conducted, the etch stop layer 410 is removed from the second area 404. In some examples, the removal of the etch stop layer 410 may also remove a portion of the dielectric layer 326 formed on the second area 404.

Figure 4F:
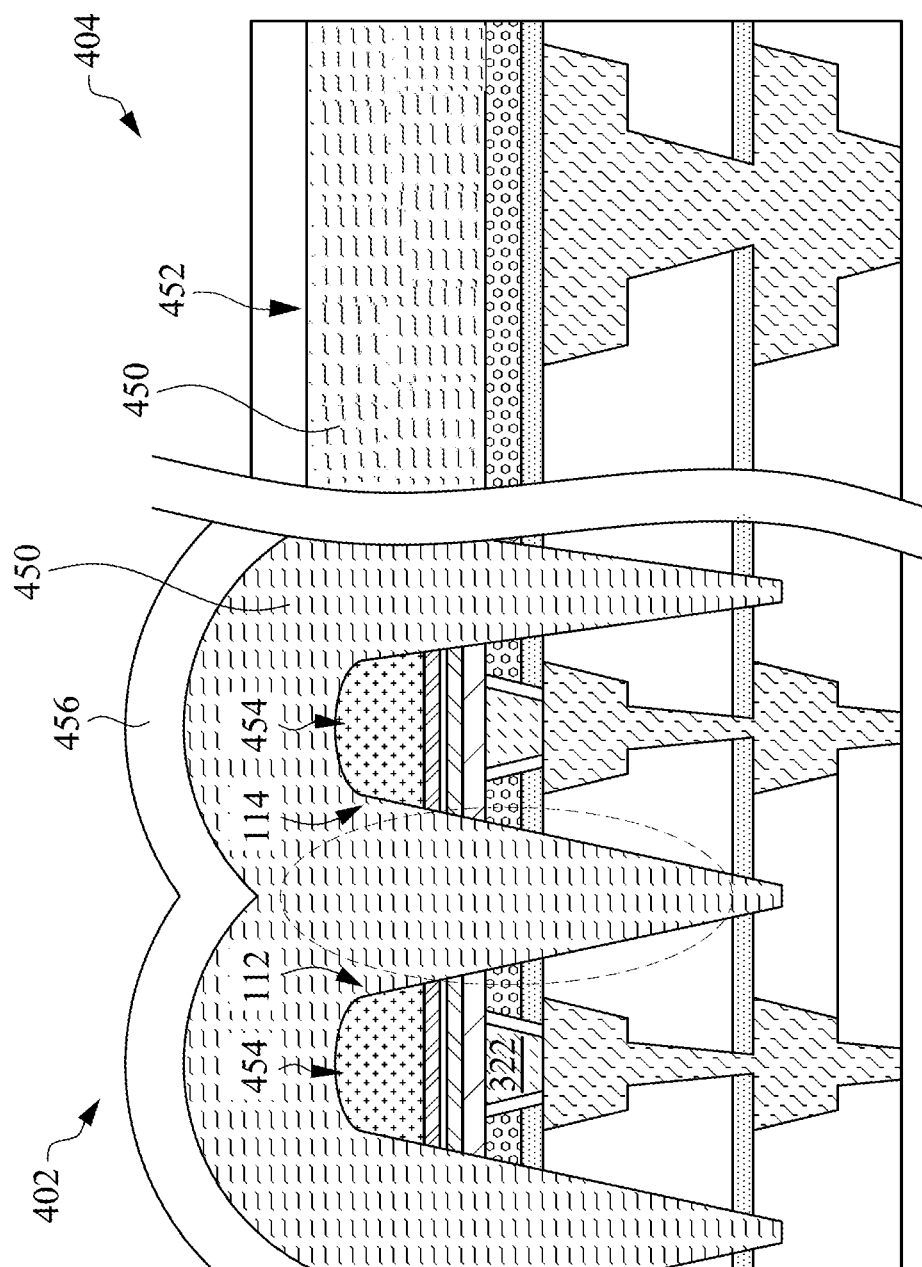

In FIG. 4F, a gap-filling dielectric layer 450 is formed to fill the recess 440. In an embodiment, the gap-filling dielectric layer 450 is a high density plasma ("HDP") dielectric or a high aspect ratio process (HARP) dielectric for the gap filling properties thereof. In some embodiments, because of the shapes of the MTJ structures 112, 114, the gap-filling dielectric layer 450 may include protrusion portions over the MTJ structures 112, 114. In some embodiments, a top surface 452 of the gap-filling dielectric layer 450 in the second area 404 is below the top surfaces 454 of the MTJ structures 112, 114. A CMP stop layer 456, e.g., of SiN, is globally formed over the gap-filling dielectric layer 450.

Figure 4G:
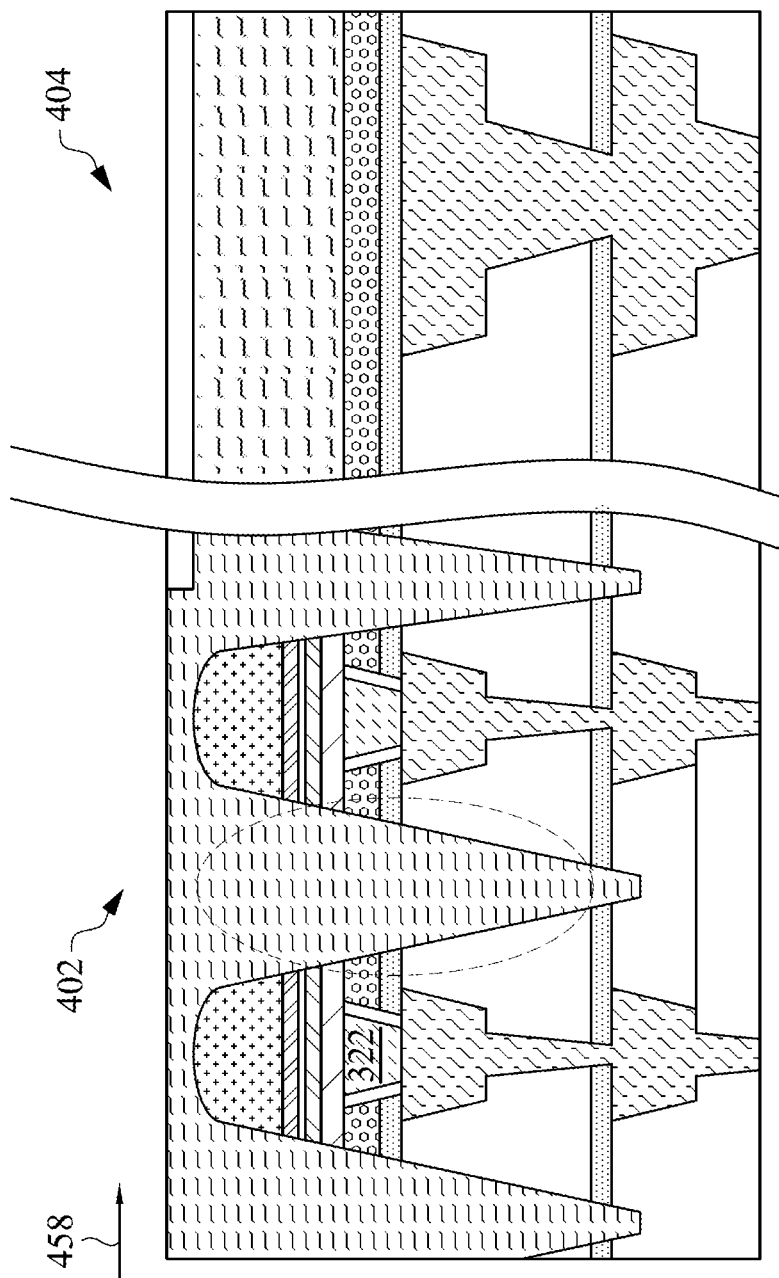

In FIG. 4G, a CMP or other polishing process 458 is performed on the wafer 300, removing a portion of the CMP stop layer 456 and a portion of the gap-filling-dielectric layer 450 in the first area 402. The CMP process 458 is controlled so that the remaining gap-filling dielectric layer 450 in the first area 402 still encapsulates the MTJ structures 112, 114. In some embodiments, the gap-filling-dielectric layer 450 and at least a portion of the CMP stop layer 456 in the second area 404 will remain after the CMP process 458.

Figure 4H:
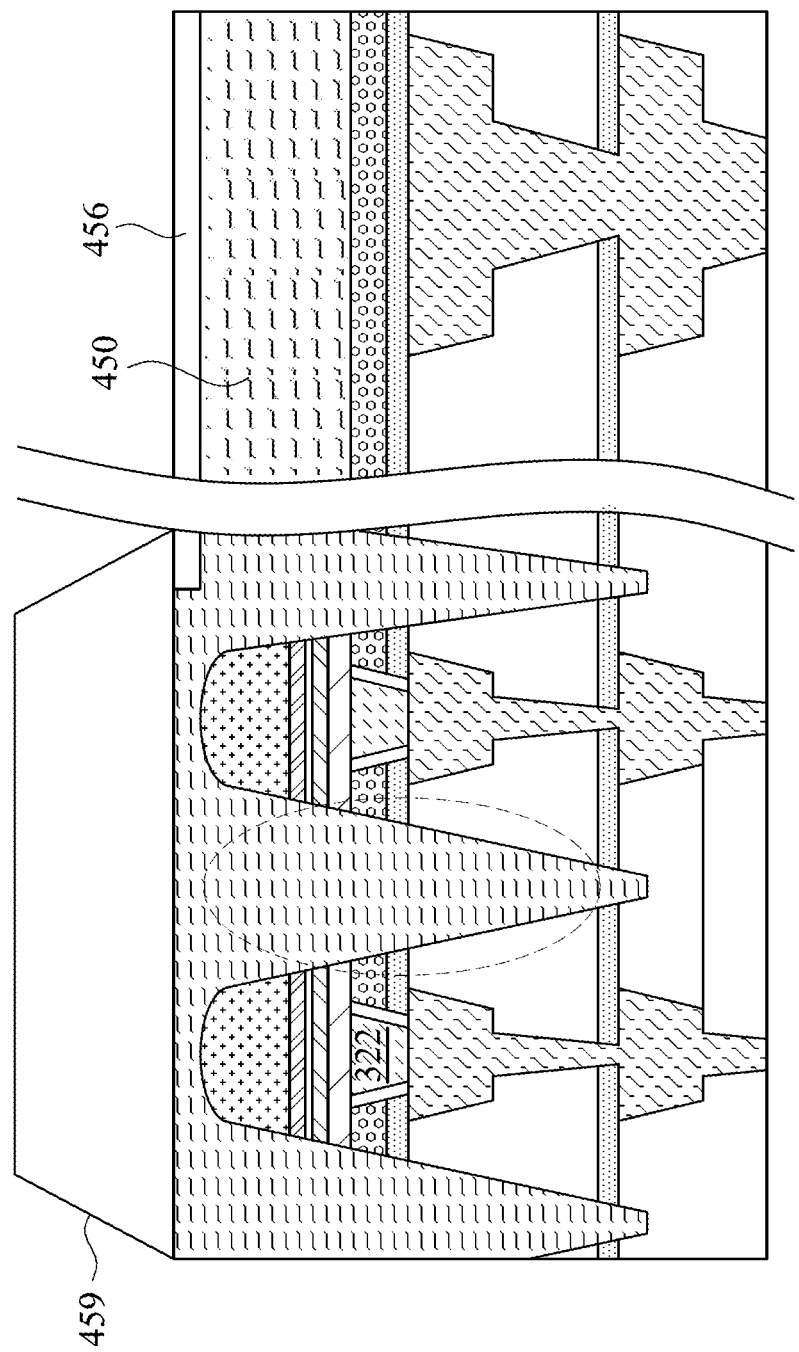
Figure 4I:
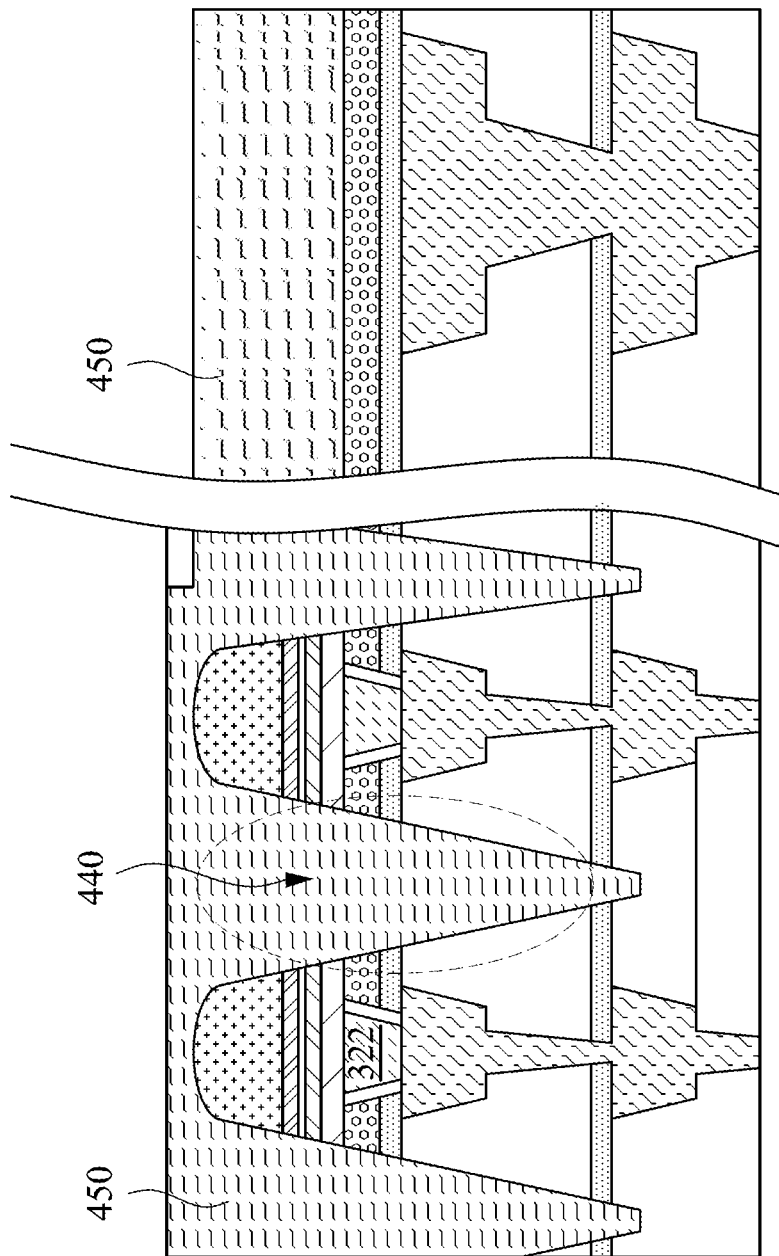

In FIGS. 4H and 4I, the remaining CMP stop layer 456 in the second area 404 is removed, e.g., by etching, with the first area 402 being covered by a mask 459.

Figure 4J:
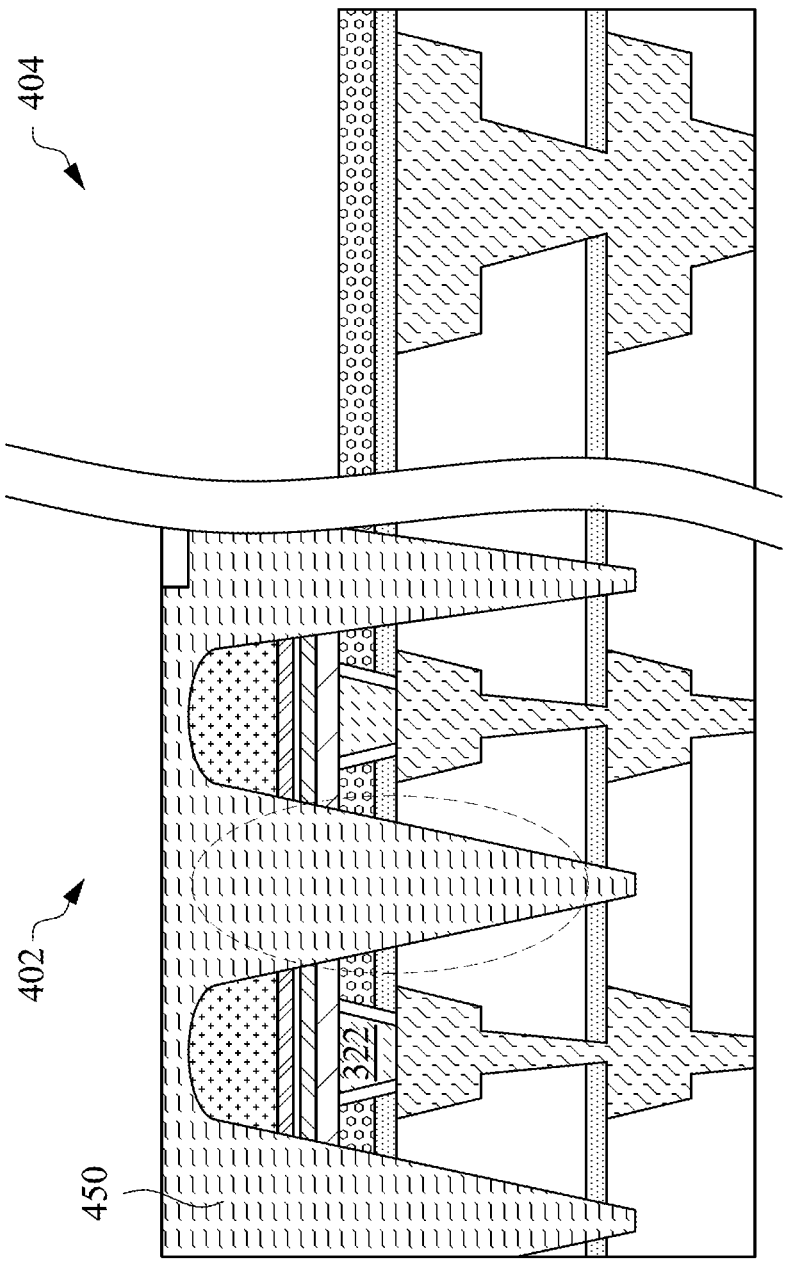

In FIG. 4J, the gap-filling dielectric layer 450 is patterned for further metallization processes to be performed over the wafer 400. For example, as shown in FIG. 4J, the gap-filling dielectric layer 450 in the second area 404 is selectively removed, while the remaining gap-filling dielectric layer 450 in the first area 402 remains encapsulating the MTJ structures 112, 114.

Figure 4K:
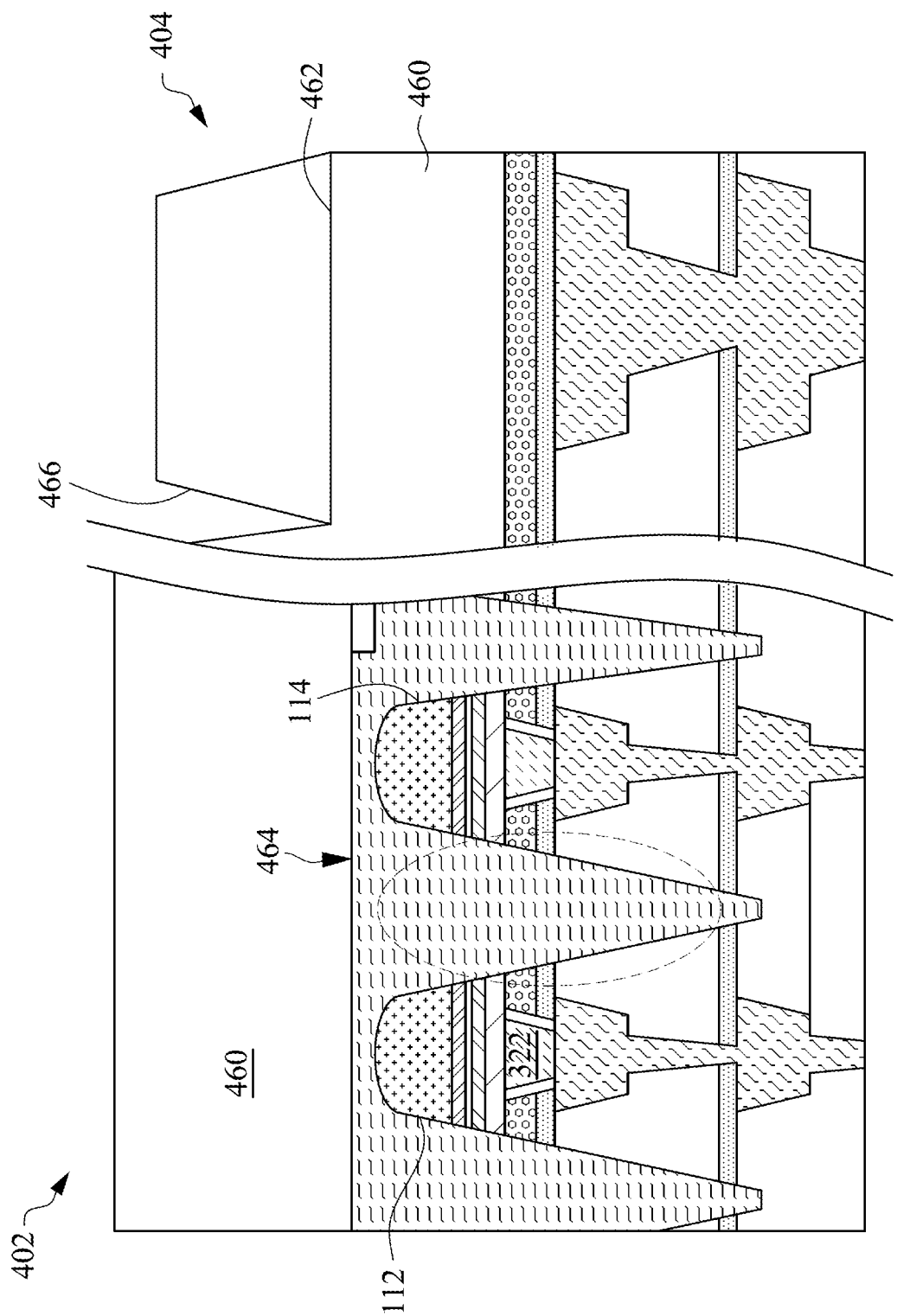

In FIG. 4K, an ILD layer 460 similar to the auxiliary ILD layers 422, 424 is globally formed over the wafer 300. In some embodiments, an upper surface 462 of the ILD layer 460 in the second area 404 is higher than an upper surface 464 of the gap-filling dielectric layer 450 that remain encapsulating the MTJ structures 112, 114 in the first area 402. A mask layer 466 is formed over the ILD layer 460 in the second area 404.

Figure 4L:
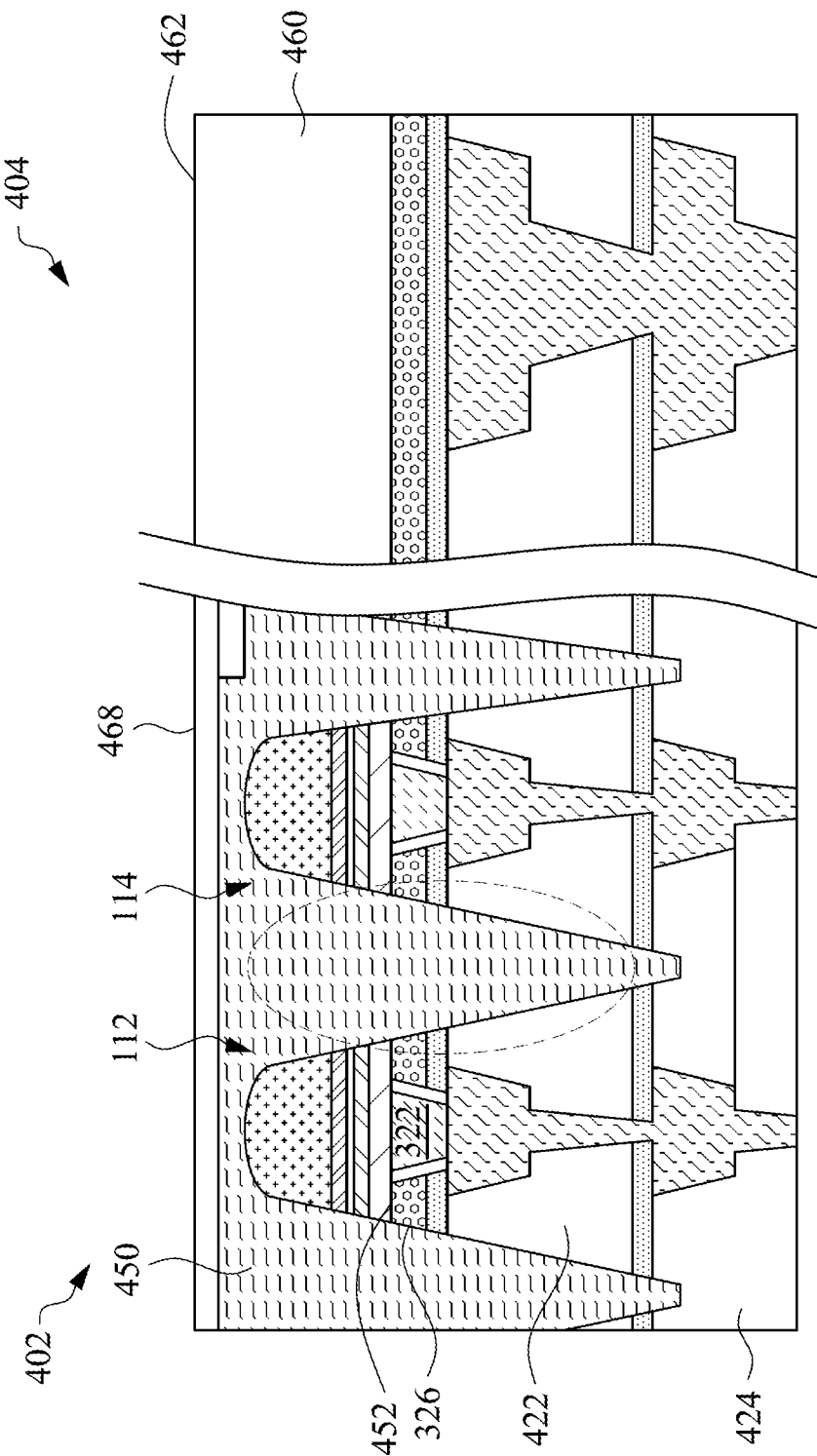

In FIG. 4L, the ILD layer 460 in the first area 402 is thinned to a level 468 that is substantially at the same level as the upper surface 462 of the ILD layer 460 in the second area 404.

The auxiliary ILD layer 422, 424 provides extra space and distance to accommodate the recess 440. As a result, the target features in the metallization levels below the auxiliary ILD layers 422, 424 are protected from being damaged by the IBE process. The IBE process ensures that the sidewalls 230 of the MTJ structures 112, 114 are not damaged by the chemical reaction of a conventional inductively coupled plasma (ICP) etching like reactive-ion etching (RIE).

Figure 4M:
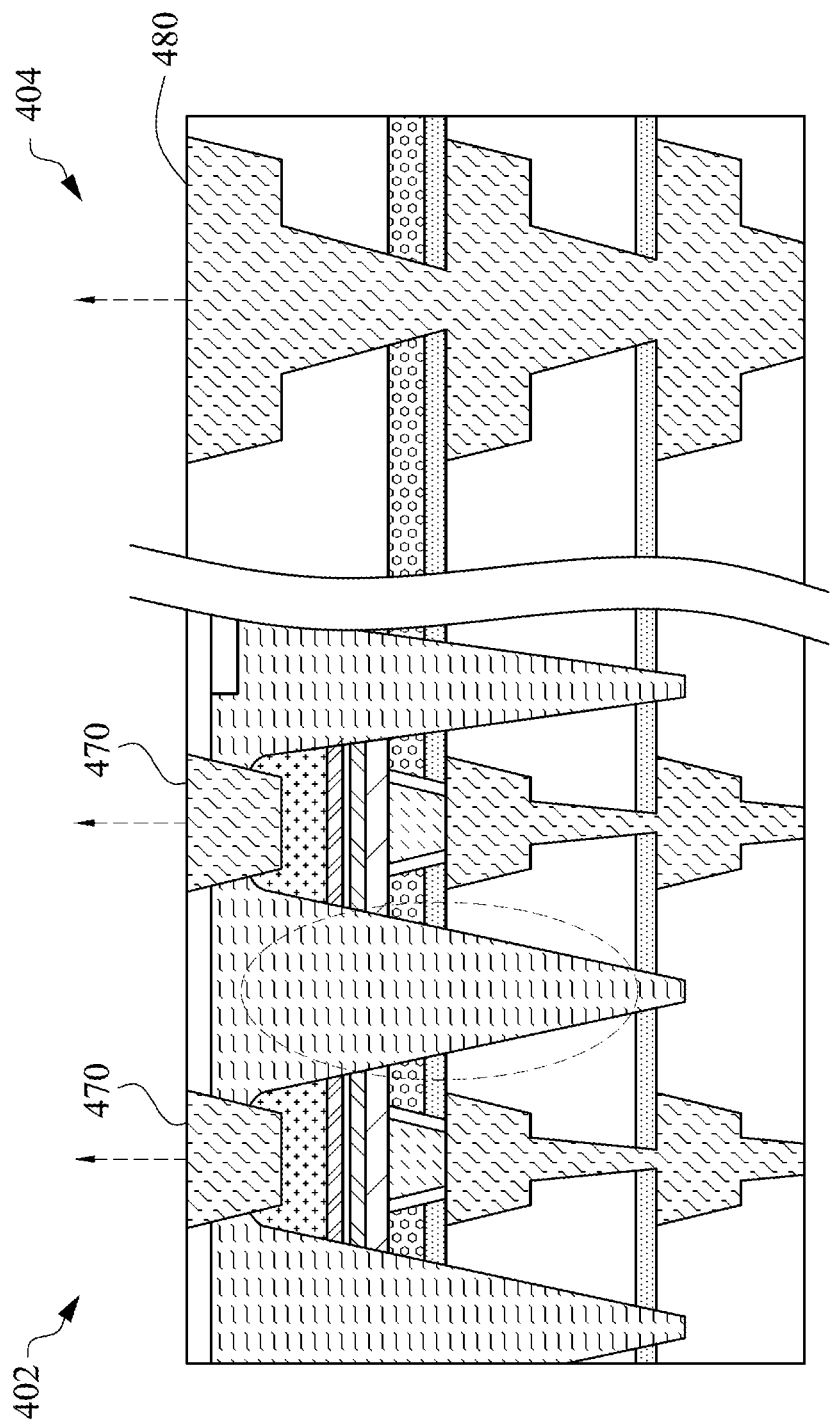

In FIG. 4M, connection structures 470 are formed in the first area 402, contacting the MTJ structures 112, 114 and interconnection structures, e.g., jumper structures or connection island structures 480 are formed in the second area 404. The features 470 (connection structures) in the first area 402 and the features 480 (connection structures) in the second area are substantially at a same level. Therefore, an integrated procedure, e.g., the back-end-of-line procedures for the logic area, can be performed on both the first area 402 and the second area 404.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the description herein, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "include" and variations thereof, such as "includes" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The present disclosure may be further appreciated with the description of the following embodiments:

In a first embodiment, a magnetic random access memory (MRAM) device, includes a conductive lower electrode; an anti-ferromagnetic layer disposed over the conductive lower electrode; a magnetic tunnel junction (MTJ) disposed over the anti-ferromagnetic layer, the MTJ including a magnetic pinned layer, a dielectric barrier layer arranged over the magnetic pinned layer, and a magnetic free layer arranged over the dielectric barrier layer; a first via structure connected to and below the conductive lower electrode, the first via structure being surrounded by a first dielectric layer; and a metal jumper structure connected to and below the first via structure, the metal jumper structure being surrounded by a second dielectric layer.

In a second embodiment, a magnetic random access memory (MRAM) device includes a first MRAM cell and a second MRAM cell. The first MRAM cell includes a first conductive lower electrode; a first magnetic tunnel junction (MTJ) disposed over the first conductive lower electrode, the first MTJ including a first magnetic pinned layer, a first dielectric barrier layer arranged over the first magnetic pinned layer, and a first magnetic free layer arranged over the first dielectric barrier layer; and a first via structure connected to and below the first conductive lower electrode, the first via structure being surrounded by a first dielectric layer. The second MRAM cell includes: a second conductive lower electrode; a second magnetic tunnel junction (MTJ) disposed over the second conductive lower electrode, the second MTJ including a second magnetic pinned layer, a second dielectric barrier layer arranged over the second magnetic pinned layer, and a second magnetic free layer arranged over the second dielectric barrier layer; and a second via structure connected to and below the second conductive lower electrode, the second via structure being surrounded by the first dielectric layer. The MRAM device further includes and a dielectric body laterally disposed between the first conductive lower electrode and the second conductive lower electrode, the dielectric body extending vertically through the first dielectric layer.

In a third embodiment, a method includes: forming a conductive jumper structure in a first dielectric layer over a wafer, the wafer including a transistor and a plurality of metallization levels over the transistor; forming a first via structure over the conductive jumper structure in a second dielectric layer over the first dielectric layer, the second dielectric layer having a different dielectric material from that of the first dielectric layer; and forming a first stack of layers over the first via structure. The first stack of layers includes: a lower electrode; an anti-ferromagnetic layer over the lower electrode layer; a magnetic pinned layer over the anti-ferromagnetic layer; a dielectric barrier layer arranged over the magnetic pinned layer; and a magnetic free layer arranged over the dielectric barrier layer. The method further includes: patterning the first stack of layers together using ion beam etching, the ion beam etching forming a recess that extends through the second dielectric layer; and forming a third dielectric layer filling the recess.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM) device, comprising:
    a conductive lower electrode;
    an anti-ferromagnetic layer disposed over the conductive lower electrode;
    a magnetic tunnel junction (MTJ) disposed over the anti-ferromagnetic layer, the MTJ including a magnetic pinned layer, a dielectric barrier layer arranged over the magnetic pinned layer, and a magnetic free layer arranged over the dielectric barrier layer;
    a first via structure connected to and below the conductive lower electrode, the first via structure being surrounded by a first dielectric layer;
    a metal jumper structure connected to and below the first via structure, the metal jumper structure being surrounded by a second dielectric layer; and
    a dielectric body disposed adjacent to the MTJ, the dielectric body extending downward through the first dielectric layer, the dielectric body having a different dielectric material from that of the first dielectric layer.

2. The MRAM device of claim 1, wherein the MTJ includes a sloped sidewall and the magnetic pinned layer includes a larger width than the magnetic free layer.

3. The MRAM device of claim 2, wherein the anti-ferromagnetic layer includes a larger width than the magnetic pinned layer.

4. The MRAM device of claim 1, wherein the dielectric body extends downward partially into the second dielectric layer and stops before reaching a bottom surface of the second dielectric layer.

5. The MRAM device of claim 1, wherein the dielectric body is laterally adjacent to the lower electrode.

6. The MRAM device of claim 1, wherein the first via structure includes a different conductive material from that of the metal jumper structure.

7. The MRAM device of claim 1, wherein the first via structure is TiN.

8. The MRAM device of claim 1, wherein the first dielectric layer is one or more of SrO or TEOS.

9. The MRAM device of claim 1, wherein the first dielectric layer is thinner than the second dielectric layer.

10. The MRAM device of claim 1, wherein the first via structure is surrounded by a barrier layer of one or more of Ta or TaN.

11. The MRAM device of claim 1, wherein the conductive lower electrode is laterally adjacent to a dielectric layer that is different from the first dielectric layer.

12. A magnetic random access memory (MRAM) device, comprising:
    a first MRAM cell including:
        a first conductive lower electrode;
        a first magnetic tunnel junction (MTJ) disposed over the first conductive lower electrode, the first MTJ including a first magnetic pinned layer, a first dielectric barrier layer arranged over the first magnetic pinned layer, and a first magnetic free layer arranged over the first dielectric barrier layer; and
        a first via structure connected to and below the first conductive lower electrode, the first via structure being surrounded by a first dielectric layer;
    a second MRAM cell including:
        a second conductive lower electrode;
        a second magnetic tunnel junction (MTJ) disposed over the second conductive lower electrode, the second MTJ including a second magnetic pinned layer, a second dielectric barrier layer arranged over the second magnetic pinned layer, and a second magnetic free layer arranged over the second dielectric barrier layer; and
        a second via structure connected to and below the second conductive lower electrode, the second via structure being surrounded by the first dielectric layer; and
    a dielectric body laterally disposed between the first conductive lower electrode and the second conductive lower electrode, the dielectric body extending vertically through the first dielectric layer.

13. The MRAM device of claim 12, wherein the dielectric body includes a different dielectric material from the first dielectric layer.

14. The MRAM device of claim 12, wherein the dielectric body includes one or more of a high density plasma dielectric or a high aspect ratio process (HARP) dielectric material.

15. The MRAM device of claim 12, further comprising a first jumper structure disposed directly below and connected to the first via structure, and a second jumper structure disposed directly below and connected to the second via structure.

16. The MRAM device of claim 15, wherein the dielectric body is disposed laterally between the first jumper structure and the second jumper structure.

17. The MRAM device of claim 15, wherein the first jumper structure and the second jumper structure each includes a different conductive material from those of the first via structure and the second via structure, respectively.

18. A method, comprising:
   forming a conductive jumper structure in a first dielectric layer over a wafer, the wafer including a transistor and a plurality of metallization levels over the transistor;
   forming a first via structure over the conductive jumper structure in a second dielectric layer over the first dielectric layer, the second dielectric layer having a different dielectric material from that of the first dielectric layer;
   forming a first stack of layers over the first via structure, the first stack of layers including:
   a lower electrode;
   an anti-ferromagnetic layer over the lower electrode layer;
   a magnetic pinned layer over the anti-ferromagnetic layer;
   a dielectric barrier layer arranged over the magnetic pinned layer; and
   a magnetic free layer arranged over the dielectric barrier layer;
   patterning the first stack of layers together using ion beam etching, the ion beam etching forming a recess that extends through the second dielectric layer; and
   forming a third dielectric layer filling the recess.

19. The method of claim 18, wherein the recess extends partially into the first dielectric layer.

* * * * *